(12) United States Patent
Johansen et al.

(10) Patent No.: US 10,788,598 B2
(45) Date of Patent: Sep. 29, 2020

(54) METHOD OF PREDICTING PARAMETERS OF A GEOLOGICAL FORMATION

(71) Applicant: Bergen Teknologioverføring AS, Bergen (NO)

(72) Inventors: Tor Arne Johansen, Bergen (NO); Erling Hugo Jensen, Bergen (NO)

(73) Assignee: BERGEN TEKNOLOGIOVERFØRING AS, Bergen (NO)

( * ) Notice: Subject to any disclaimer, the term of this patent is extended or adjusted under 35 U.S.C. 154(b) by 345 days.

(21) Appl. No.: 15/747,090

(22) PCT Filed: Jul. 20, 2016

(86) PCT No.: PCT/EP2016/001265
§ 371 (c)(1),
(2) Date: Jan. 23, 2018

(87) PCT Pub. No.: WO2017/016655
PCT Pub. Date: Feb. 2, 2017

(65) Prior Publication Data
US 2018/0372896 A1 Dec. 27, 2018

(30) Foreign Application Priority Data
Jul. 24, 2015 (EP) .................................... 15002194

(51) Int. Cl.
*G01V 1/30* (2006.01)
*G01V 11/00* (2006.01)
(Continued)

(52) U.S. Cl.
CPC .............. *G01V 1/306* (2013.01); *G01V 11/00* (2013.01); *G06F 30/20* (2020.01); *G06N 7/005* (2013.01);
(Continued)

(58) Field of Classification Search
None
See application file for complete search history.

(56) References Cited

U.S. PATENT DOCUMENTS 8,095,345 B2 * 1/2012 Hoversten .............. G01V 11/00
703/2

OTHER PUBLICATIONS

D. Grana et al.; "Probabilistic petrophysical-properties estimation Integrating statistical rock physics with seismic Inversion"; GEOPHYSICS, vol. 75, No. 3, May-Jun. 2010, pp. O21-O37.
(Continued)

*Primary Examiner* — Roy Y Yi
(74) *Attorney, Agent, or Firm* — Arent Fox LLP

(57) ABSTRACT

A method of predicting model parameters ($R_1$, $R_2$, $R_3$, ... ) of a geological formation under investigation, wherein said geological formation is distinguished by reservoir parameters including observable data parameters and the model parameters ($R_1$, $R_2$, $R_3$, ... ) to be predicted, comprises the steps of calculating at least one model constraint ($M_1$, $M_2$, $M_3$, ... ) of the model parameters ($R_1$, $R_2$, $R_3$, ... ) by applying at least one rock physics model ($f_1$, $f_2$, $f_3$, ... ) on the model parameters ($R_1$, $R_2$, $R_3$, ... ), said at least one model constraint ($M_1$, $M_2$, $M_3$, ... ) including modelled data of at least one of the data parameters, and applying an inverse model solver process on observed input data ($d_1$, $d_2$, $d_3$, ... ) of at least one of the data parameters, including calculating predicted model parameters, which comprise values of the model parameters ($R_1$, $R_2$, $R_3$, ... ) which give a mutual matching of the input data and the modelled data, wherein the modelled data are provided with probability distribution functions, the inverse model solver process is conducted based on the probability distribution functions, wherein multiple predicted values of the model parameters are obtained comprising values of the model parameters ($R_1$, $R_2$, $R_3$, ... ) which give the mutual matching
(Continued)

of the input data and the modelled data, and model probabilities of the predicted model parameters are calculated in dependency on the probability distribution functions.

17 Claims, 10 Drawing Sheets

(51) Int. Cl.
*G06F 30/20* (2020.01)
*G06N 7/00* (2006.01)
(52) U.S. Cl.
CPC .......... *G01V 2210/624* (2013.01); *G01V 2210/6222* (2013.01); *G01V 2210/6224* (2013.01); *G01V 2210/6242* (2013.01); *G01V 2210/6244* (2013.01); *G01V 2210/665* (2013.01); *G01V 2210/667* (2013.01)

(56) References Cited

OTHER PUBLICATIONS

D. Gray et al.; The Application of Avo and Inversion to the Estimation of Rock Properties; CSEG Recorder, May 2001, pp. 36-40.
International Search Report issued for PCT/EP2016/001265, dated Oct. 14, 2016, 3 pages.
L.-J. Gelius et al.; "Modeling production caused changes in conductivity for a siliciclastic reservoir: a differential effective medium approach"; Geophysical Prospecting, 2008, vol. 56, pp. 677-691.
M. Bosch et al.; "Seismic inversion for reservoir properties combining statistical rock physics and geostatistics: A review"; GEOPHYSICS, vol. 75, No. 5, Sep.-Oct. 2010, pp. 75A165-75A176.
P. Avseth et al.; "Rock-physics diagnostics of depositional texture, diagenetic alterations, and reservoir heterogeneity in high-porosity siliciclastic sediments and rocks—A review of selected models and suggested work flows"; GEOPHYSICS, vol. 75, No. 5, Sep.-Oct. 2010, pp. 75A31-75A47.
T. Mukerjl et al.; "Statistical rock physics. Combining rock physics, information theory, and geostatistics to reduce uncertainty in seismic reservoir characterization"; The Leading Edge, Mar. 2001, pp. 313-319.
T. Stenvold et al.; "Gravimetric monitoring of gas-reservoir water influx—A combined flow- and gravity-modeling approach"; GEOPHYSICS, vol. 73, No. 6, Nov.-Dec. 2008, pp. WA123-WA131.
T.A. Johansan et al.; "Inverse rock physics modeling for reservoir quality prediction"; GEOPHYSICS, vol. 78, No. 2, Mar.-Apr. 2013. pp. M1-M18.
Danish Search Report issued for Danish Application No. PA 2018 70074, dated Oct. 23, 2018.
K. Mosegaard et al.; "Probabilistic Approach to Inverse Problems"; International Handbook of Earthquake & Engineering Seismology, vol. 81A, Academic Press, 2002, pp. 237-265.
Tor Erik Rabben at al.; "Non-linear Bayesian joint inversion of seismic reflection coefficients"; Geophysical Journal Inernational, 2008, vol. 173, pp. 265-280.

\* cited by examiner

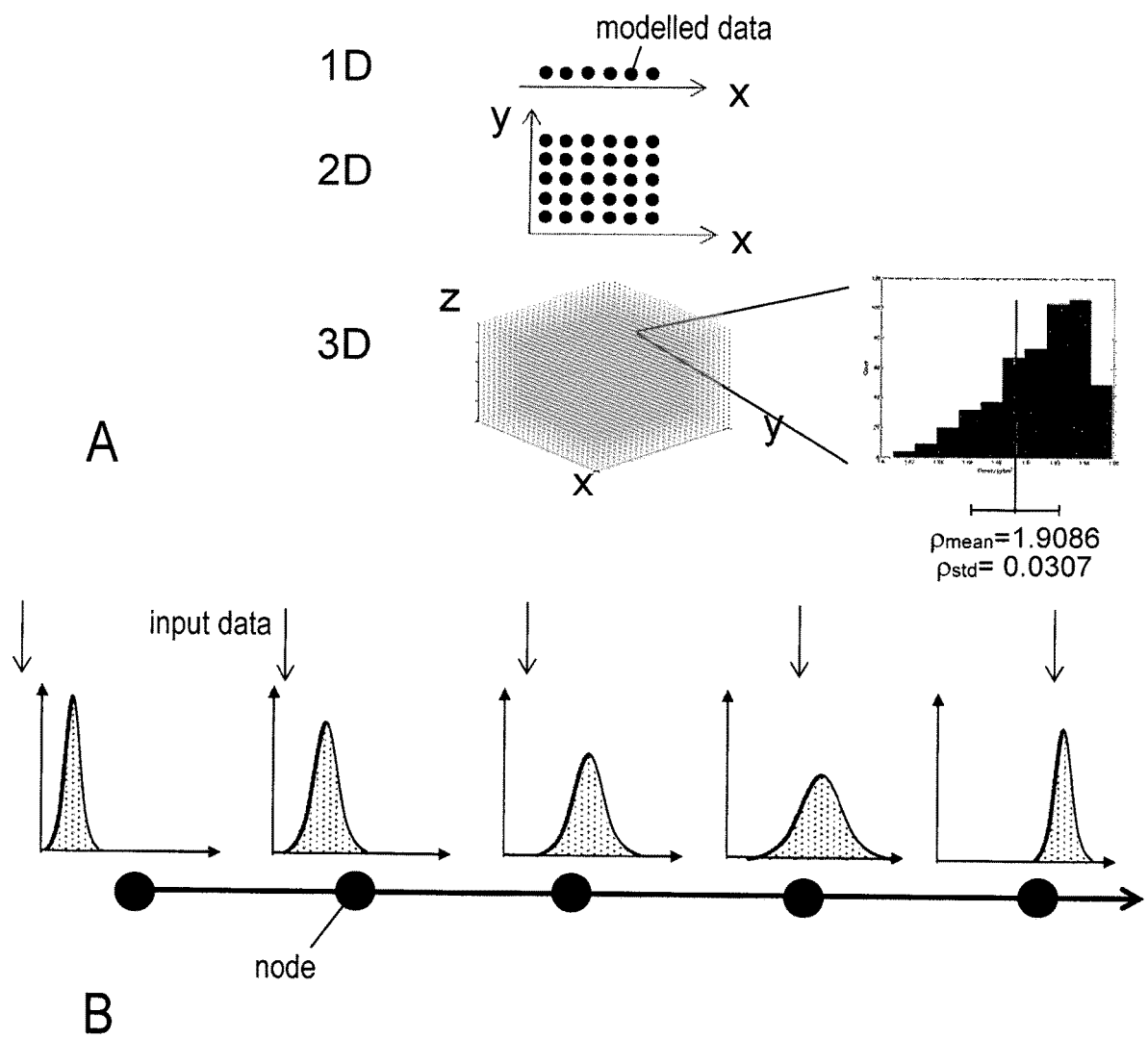
FIG. 6 (A, B)

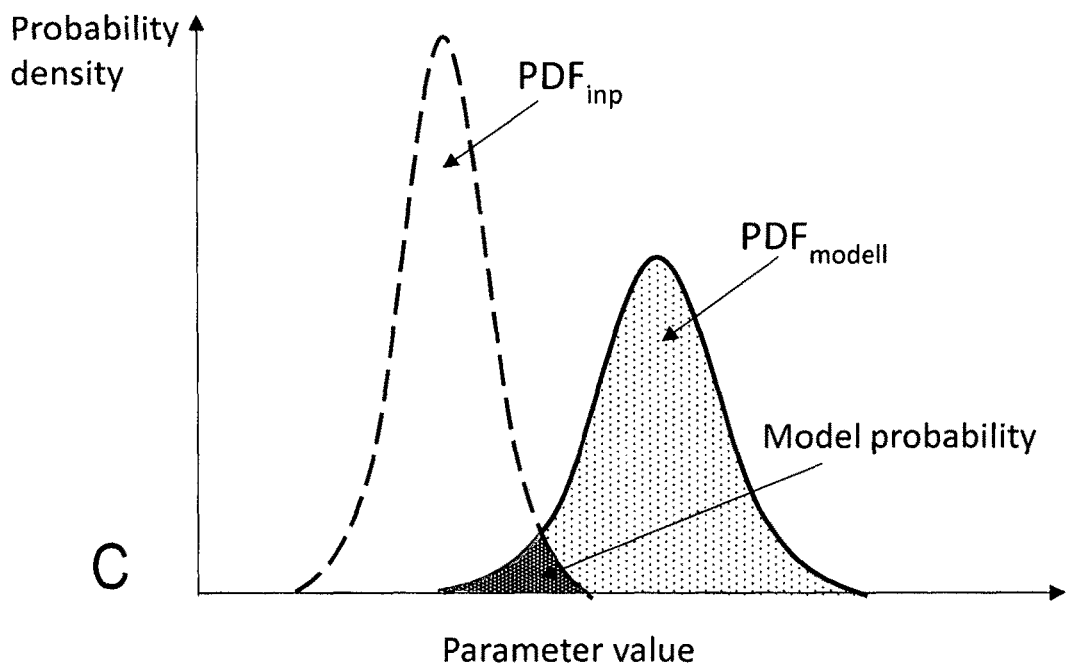
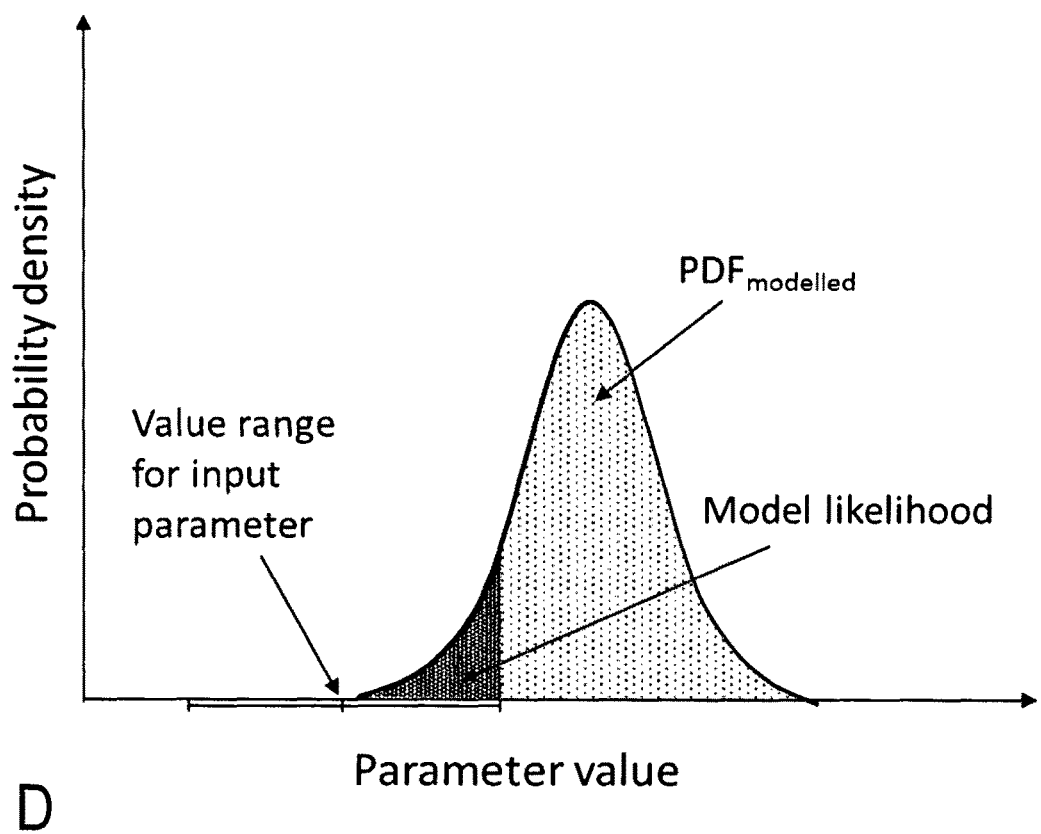
FIG. 6 (C, D)

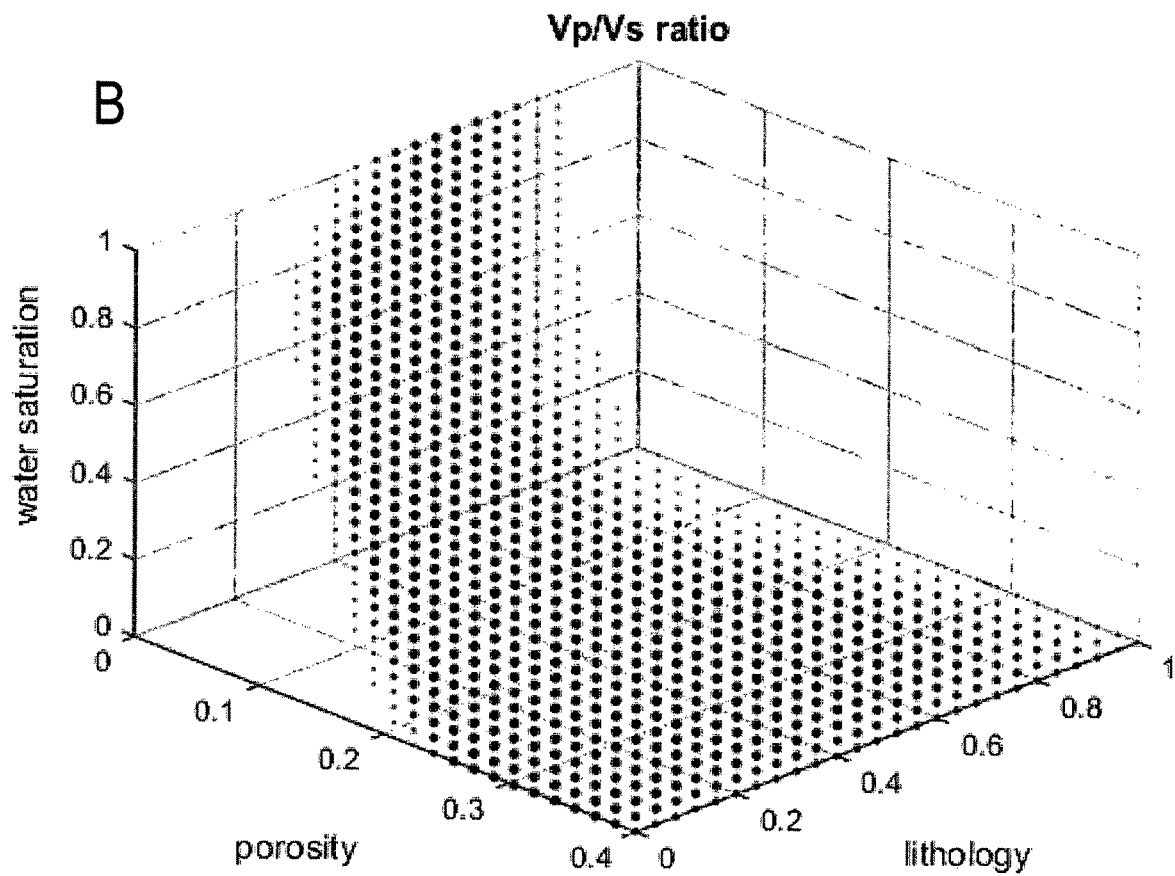
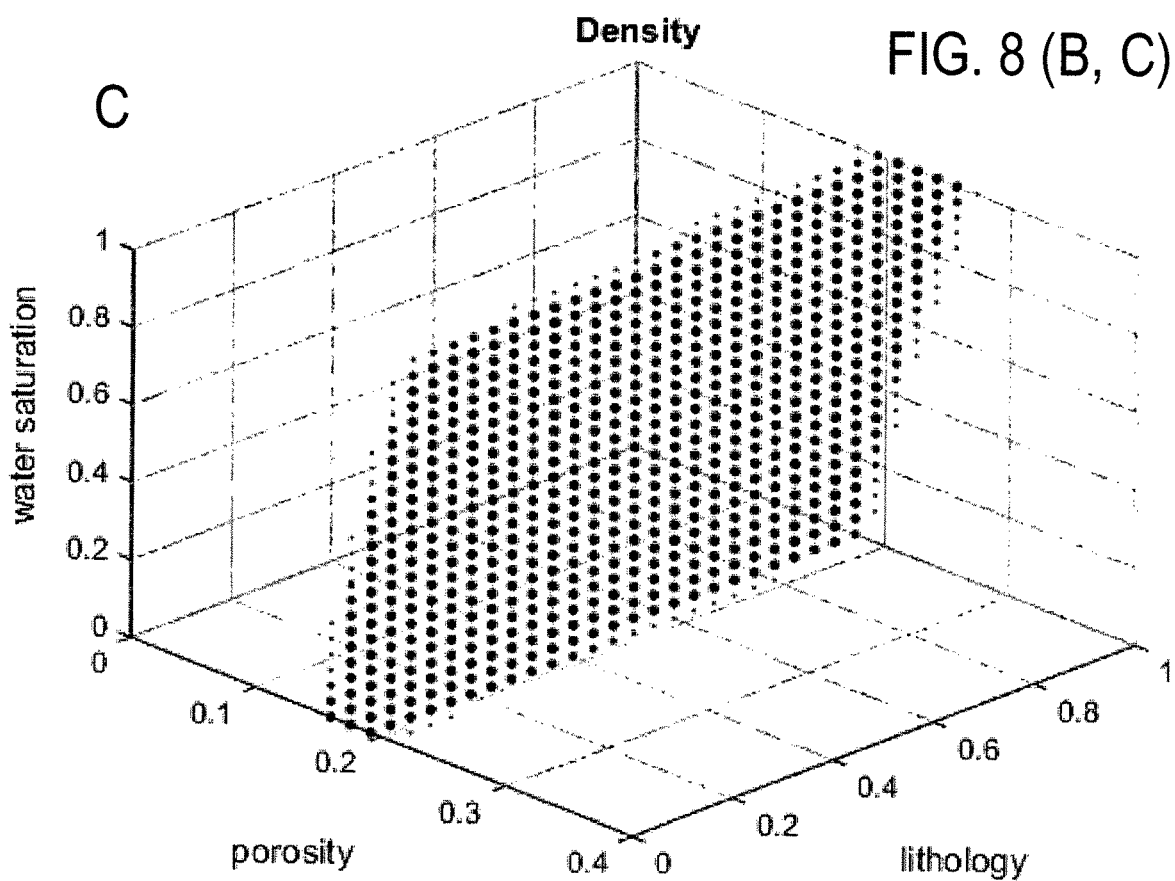
FIG. 8 (B, C)

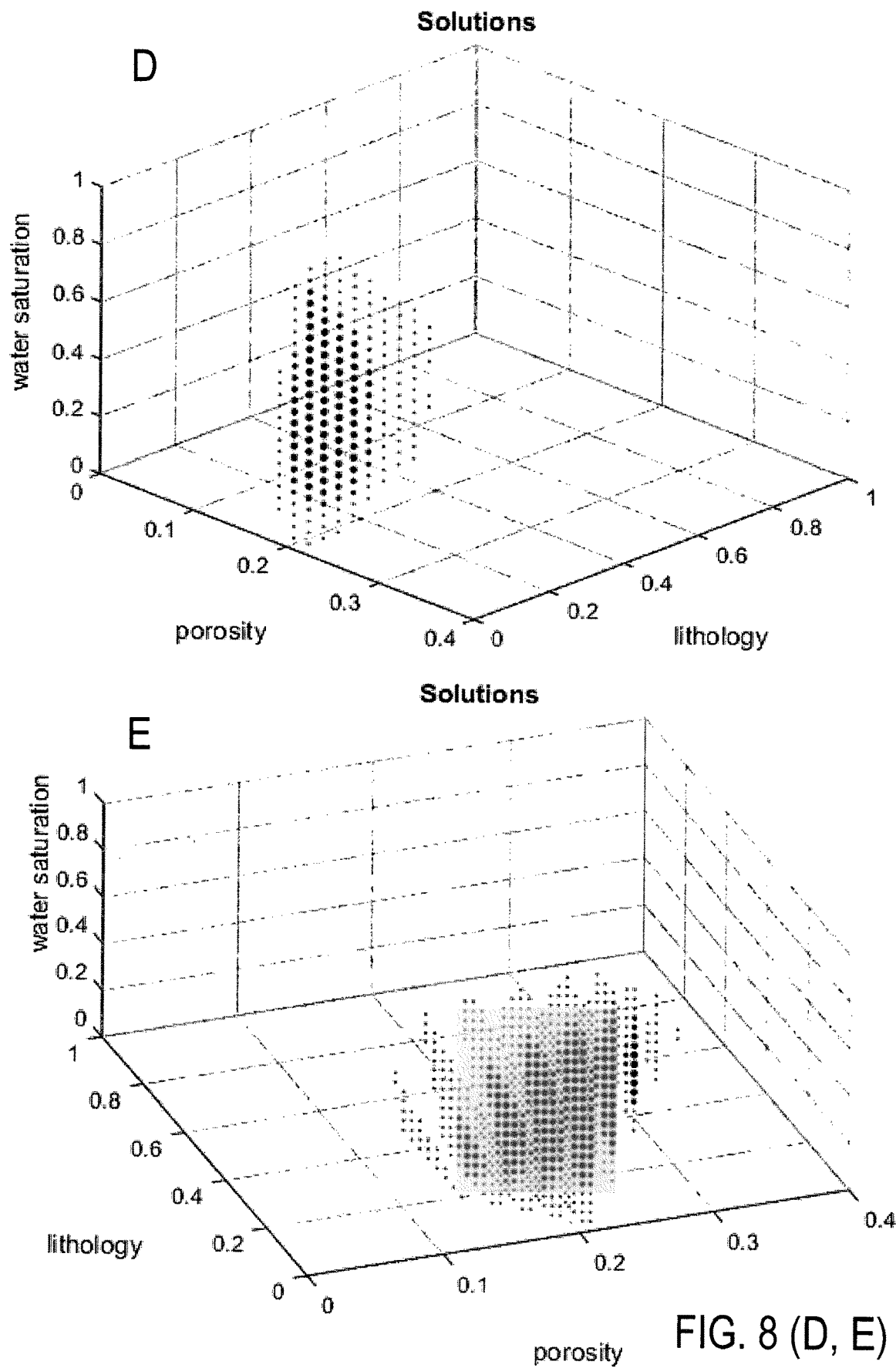
FIG. 8 (D, E)

METHOD OF PREDICTING PARAMETERS OF A GEOLOGICAL FORMATION

CROSS-REFERENCE TO RELATED APPLICATIONS

This application is the U.S. National Stage Application of International Patent Application No. PCT/EP2016/001265, filed on Jul. 20, 2016, which claims priority to EP Application No. 15002194.7, filed on Jul. 24, 2015, the contents of each of which is incorporated herein by reference in its entirety.

FIELD OF THE INVENTION

The present invention relates to a method of predicting parameters of a geological formation under investigation by inverse rock physics modelling (IRPM). Applications of the invention are available in the fields of investigating and characterizing geological formations, in particular geological reservoirs including hydrocarbons, like gas or oil.

BACKGROUND OF THE INVENTION

In reservoir characterization, an important task is to map the earth's structure and properties, typically with the goal of locating hydrocarbons. The effective rock physics properties, e.g. its density and the velocities of acoustic waves propagating through the rock, depend on the intrinsic properties of the rock constituents, their volume fractions, composition and under which conditions (reservoir conditions) they are located. The reservoir conditions are specified by various reservoir parameters, e.g. constituent, densities and stiffnesses, cementation, inclusion geometries, temperature, pressure and mixing models. There exists many rock physics models for modelling the effective rock properties based on the reservoir parameters (forward modelling). In case of seismic data, another forward modelling step can be done to model the seismic response from layer interfaces based on the effective rock properties. This is similar for other measurements, such as resistivity in a controlled source electromagnetic survey.

However, in a reservoir characterization setting, where a seismic survey has been done, the task is to determine the reservoir parameters based on the seismic response. This can be done through inverse modelling, e. g. by IRPM, either directly from the seismic attributes, or stepwise; first, e. g. using Bayesian seismic inversion to invert for the effective rock properties, and then proceeding to invert for the reservoir parameters using IRPM.

Predicting reservoir parameters of a geological formation by IRPM has been described by T. A. Johansen et al. in "Geophysics" (vol. 78 (2), 2010, p. M1-M18) and in the dissertation of Erling Hugo Jensen "Methods for improved prediction of elastic, electrical and reservoir properties", University of Bergen, Norway, 2011. Generally, the reservoir parameters include observable data parameters, which can be derived from measurements, like seismically derived properties such as P- and S-wave velocities, acoustic impedances, elastic impedances, or other, and model parameters, which are to be predicted for a reservoir characterization, describing e. g. lithology or other reservoir conditions. For describing a relationship between the data parameters and the model parameters, rock physics models have been suggested as summarized by T. A. Johansen et al. In practice, the number of reservoir parameters in a rock physics model is often higher than the number of available observable input data parameters, resulting in an underdetermined problem with non-unique solutions. In IRPM, this is addressed by identifying certain model parameters to be predicted, e.g. porosity, lithology and fluid saturation, from the reservoir parameters. The remaining reservoir parameters are calibrated based on available data.

IRPM provides a solution of the underdetermined problem by a numerical reformulation of rock physics models so that the seismic data parameters are input and model parameters, like porosity, lithology and fluid saturation, are output. Briefly summarized, IRPM includes calculating model constraints (so-called constraint cubes) through a forward modelling step, wherein reservoir parameters together with various combinations of the model parameters are used as input to a rock physics model to calculate effective rock properties. In the inverse modelling step, an IRPM solver is applied which identifies model parameters matching the observable input data (i.e. the effective rock properties). A rock physics model is applied on the model parameters, wherein the model constraints include modelled data of the data parameters, and the inverse model solver process is applied on observable input data of the data parameters. Predicted model parameters are calculated, which comprise values of the model parameters which provide a mutual matching of the input data and the modelled data.

In a practical example, the IRPM uses three model parameters to vary in the modelling, typically porosity, clay-to-quartz volume fraction (i.e. lithology) and fluid saturation (often referred to as PLF). One set of PLF values (i.e. a node in the constraint cube) will correspond to one data parameter value, e.g. one density, bulk and shear modulus value, and similar for other elastic and acoustic properties. All other model parameters are calibrated to static values, but various realizations of the same model can be created by providing new sets of these static model parameters.

The IRPM solver described by T. A. Johansen et al. can be done for several rock physics models and model realizations. In the inverse model solver process, solutions for one input data parameter are identified through interpolation of the model space, wherein uncertainty in data and model is combined through specification of a global proximity factor. Although it provides quite robust data parameter combinations to use for either porosity, lithology and pore fluid prediction, limitations have been found in practical applications of the conventional IRPM method. In particular, there is no reliable measure for assessing the performance of the models. In other words, applying different rock physics models provides various (non-unique) solutions, which cannot be evaluated against each other. The handling of uncertainty through the use of the proximity factor is also quite unrefined and does not well reflect information about uncertainty in the various reservoir parameters.

OBJECTIVE OF THE INVENTION

The objective of the invention is to provide an improved method of predicting model parameters of a geological formation under investigation, in particular for the purpose of characterizing geological reservoirs containing hydrocarbons, which is capable of avoiding disadvantages of conventional techniques. In particular, the objective is to provide the method of predicting model parameters which better handles uncertainties without loss in modelling performance and enables evaluating modelling results and/or predicting model parameters with improved reliability and reproducibility.

SUMMARY OF THE INVENTION

The above objective is solved by a method of predicting model parameters comprising the features of claim 1. Advantageous embodiments and applications of the invention are defined in the dependent claims.

According to a general teaching of the invention, a method of processing observable data parameters of a geological formation under investigation, in particular for predicting values of model parameters of the geological formation is suggested, wherein the geological formation is characterized by reservoir parameters including the observable data parameters and the model parameters to be predicted. The inventive method comprises a step of calculating model constraints of the model parameters by applying at least one rock physics model on the model parameters, wherein the model constraints include modelled data of at least one of the data parameters. Furthermore, the inventive method comprises a step of applying an inverse model solver process on the observed input data of the at least one of the data parameters, wherein predicted model parameters are calculated, which comprise values of the model parameters providing a mutual matching of the input data and the modelled data.

According to the invention, the modelled data are provided with probability distribution functions (PDFs). Accordingly, a plurality of modelled data are created in a forward modelling step, in particular by calculating the model constraints, resp., representing distribution functions of the modelled data. Furthermore, according to the invention, the inverse model solver process is conducted based on these probability distribution functions. Multiple predicted model parameters are obtained comprising values of the model parameters which give a mutual matching of the input data and the modelled data. Furthermore, according to the invention, model probabilities (or: model likelihoods) of the predicted model parameters are calculated in dependency on the probability distribution functions of the data parameters. The model probabilities are used for evaluating the predicted model parameters and characterizing the geological formation. In particular, they can be used to calculate weighted means of model parameters which together with the standard deviation can be used for reservoir characterization.

In particular, a Monte Carlo simulation is applied in the forward modelling step (and not the inverse modelling step, as was the approach described in Johansen et al.). Accordingly, a plurality of model constraints (constraint cubes) are created; e.g. one set of PLF values (i.e. a node in the constraint cube) will not correspond to only one data parameter value anymore, e.g. one density, bulk and shear modulus value, but instead a range of values. This distribution of values can in turn be characterized e.g. by a mean and standard deviation; which can be used to specify a probability distribution function of the forward modelled effective properties corresponding to one node in the constraint cube.

The inventors have found that the handling of uncertainty is quite unrefined in the suggested approach by Johansen et al. The main method of handling uncertainty is through the use of a proximity factor. But it is a diffuse parameter which does not discriminate between uncertainties associated with the various reservoir parameters and the input data. As such, a quantitative calibration of this parameter based on reported uncertainties is not feasible. Also, note that the impact of uncertainty in reservoir parameters might vary with the PLF parameters, which again is not captured through the use of the proximity factor. Johansen et al. also suggested using Monte Carlo simulation in the inversion step to handle uncertainty in the input data; i.e. repeating the inverse modelling in IRPM a number of times using probability density functions (PDF) to sample various sets of input data. The variance in the PDFs can be linked to the uncertainty in the input data. This is a common way of handling uncertainty in inverse modelling, but has the downside of increasing the processing time linearly with number of iterations in the Monte Carlo simulation.

The term "reservoir parameter" refers to any physical and/or chemical property of the geological formation, in particular the geological sections or layers thereof, like rock, sand or other facies. If not explicitly mentioned, the term parameter may refer in the following to the property considered, like porosity, or the particular quantity (value) thereof.

The reservoir parameters include a first group of data parameters comprising observed (or: observable) physical and/or chemical properties which can be derived from a measurement, e. g. directly measured or indirectly obtained from a measurement of another property of the geological formation. The quantities of the data parameters comprise input data (input data parameter values) which have been derived from the measurement and which are used as an input of the inverse model solver process. Furthermore, the data parameters comprise modelled data (modelled data parameter values), wherein the modelled data are calculated for providing the model constraints.

Furthermore, the reservoir parameters include a second group of model parameters to be predicted. It depends on the particular application of the invention, whether a considered property of the geological formation is used as a data or model parameter. Thus, the model parameter also could be a measurable property, or it is a property of the geological formation, which can be obtained by modelling only.

Practical model parameters and data parameters are described e. g. in the dissertation of Erling Hugo Jensen (cited above). With preferred examples, the model parameters and the data parameters comprise porosity, lithology, fluid saturation of the geological formation, density, elastic moduli, intercept features, temperature, pressure, velocity of seismic waves, seismic data, sonic data, controlled source electromagnetic data, electrical resistivity, gravitational data and/or parameters derivable therefrom. In the forward modelling step of IRPM, rock physics models and theories are used describing the physical relations between the various model and data parameters. These models and theories are known as such, and they are disclosed in the literature. For example, P. Avseth et al. in "Geophysics" (vol. 75 (5), 2010, p. 75A31-75A47) describe the physical relation between seismic data (elastic properties) and model parameters, D. Gray et al. in "CSEG Recorder" (vol. 26 (5), 2001, p. 36-40), describe physical relations between seismic data (AVO) and elastic properties/model parameters, L.-J. Gelius et al. in "Geophysical Prospecting" (vol. 56, 2008, p. 677-691), describe physical relations between resistivity/conductivity (CSEM) and model parameters, and T. Stenvold et al. in "Geophysics" (vol. 73 (6), p. WA123-WA131), describe physical relations between gravimetric data and reservoir/model parameters.

The term "model constraint" (also called "constraint cube") refers to a model space, which preferably has one, two or three (or even more) dimensions, wherein the axes of the model space are spanned by model parameters and the model space includes the modelled data of at least one of the data parameters associated to the model parameters by applying at least one rock physics model. Applying a rock physics model with a particular set of model parameter values represents a forward model resulting in the model constraint. In the inverse model solver process, an exhaustive search in the constraint cube is done for a match between the forward modelled and input data. In particular, the forward model is varied by varying the model parameter values until the modelled data of the model constraint match the observable input data. Preferably, the model constraint is built up by discrete quantities, and it comprises nodes of constrained model parameters being constrained by applying the at least one rock physics model. Accordingly, the model space is discretized so that applying the IRPM method is facilitated. The model constraint can be presented e. g. as a matrix or a diagram.

The term "inverse model solver process" refers to a numerical iterative process of varying model parameters, i. e. the quantities of the model parameters, until mutual matching of the modelled data to the input data is obtained. The particular type of inverse model solver process is selected from available methods, as mentioned e. g. by T. A. Johansen et al. or in the dissertation of Erling Hugo Jensen (cited above) in dependency on the requirements and conditions of applying the invention.

The term "predicting" refers to calculating values of model parameters by the inverse model solver process. Predicted model parameters are model parameter values yielding a matching of the modelled data with the input data. Model parameters to be predicted are those selected model parameter values which are obtained as a result of the inverse model solver process and evaluating the predicted model parameters using the model probabilities. The model parameters to be predicted are considered as the best representation of properties of the geological formation, which can be output as a final result of the inventive method or additionally processed for deriving further properties of the geological formation.

Advantageously, the inventors have extended the IRPM method by additionally providing model probabilities on the modelled data, thus allowing an improved evaluation of the performance of the models. The model probability (or: posteriori probability) is a measure of how well the predicted model parameters fit the data parameters, e. g. seismic inversion data used as input to the modelling, given the applied rock physics model. The model probabilities are associated with the solutions of the inverse model solver process, thus indicating how good the input data matches the rock physics model for a particular prediction of model parameters, e. g. rock properties, like porosity in reservoir rocks or kerogen content in source rocks. The invention allows to take model and data uncertainty into consideration as well as scrutinizing the non-unique solutions. To better compare the performance of e. g. two rock physics models for the different scenarios, the inventive extension to the IRPM method provides the possibility to compare the probability associated with the various predictions. Solutions for a model has implications for the other reservoir properties, geology, petrophysics, geophysics, etc., which in turn can be used to evaluate the various solutions up against each other.

As a further advantage of the invention, various methods of obtaining the model parameters to be predicted are available. According to a first variant, the model parameters to be predicted can be provided by one value of the multiple predicted model parameters having maximum model probability. Those solutions are identified which have the highest model probability. This embodiment of the invention has advantages if the model probabilities of the solutions significantly differ from each other.

Alternatively, according to a second variant, the model parameters to be predicted can be provided by expected values of a measure of variance for the multiple predicted model parameters. This embodiment of the invention has advantages if the model probabilities have slight variations only. In this case, not only one maximum likelihood solution is considered but also the other solutions. Preferably, a weighted mean value is calculated, which will not always be the same as the solution with the highest probability, but can be shifted based on the probabilities of the other solutions.

According to a third variant, the model parameters to be predicted can be provided by averaged values of the multiple predicted model parameters.

According to a further preferred embodiment of the invention, an a priori probability of the model parameters is included in the inverse model solver process, and the model parameters to be predicted have a maximum a priori probability. The a priori probability is associated with the model parameters to be predicted. As an example, if it is expected that a rock layer within the geological formation has a low porosity, a probability distribution function can be obtained for the porosity. So when the porosity is predicted using IRPM, a model probability associated with the solution can be calculated, and additionally, the a priori probability for that solution as defined by the probability distribution function can be calculated. In addition, a third combined probability of the prior two can be calculated using Bayes' theorem. Thus, according to a further embodiment of the invention, a Bayesian (or posteriori) probability can be further included in the inverse model solver process, wherein the Bayesian probability is calculated from the model probability and the a priori probability, and the model parameters to be predicted have a maximum Bayesian probability.

According to a further advantageous embodiment of the invention, calculating the model constraints comprises the steps of defining at least one subspace of the model constraints, calculating predicted subspace model parameters for the at least one subspace, and comparing the predicted subspace model parameters for the at least one subspace with the predicted model parameters of the overall model constraints. As an example, a subspace can represent a gas-filled, high porous sandstone, and it covers only parts of the whole model constraint. Having defined such a subspace makes it possible to compare the solutions within that subspace to the total (or to other subspaces). Preferably the model probabilities of all solutions within the subspace are summed up and divided by the sum of probabilities of all the solutions for providing a facies identifier. This quantifies whether a solution is more likely within or outside the subspace. Additionally, this number can be multiplied with the highest model probability within that subspace so that it can be evaluated not only if it is more likely to be within than outside the subspace, but also to have a good match between data and model within the subspace. With the above example, it can be found as to whether it is more likely to be a high porous gas sandstone compared to something else defined by the model.

Accordingly, various facies of the geological formation can be defined, e.g. a gas sandstone can be specified to be high porous and clean sands with high gas saturation. The model probability can then be used to evaluate if the model gives a good match with the input data for a given facies, and how this compares to the other facies predictions. The facies identifier can be calculated having a value between 0 and 1 which represents a poor and good match, respectively.

According to the invention, the probability distribution functions are provided for the input data and/or the modelled data of the data parameters.

Providing the PDF for the input data comprises assigning the PDF to the input data. To this end, the input data can be provided with a predetermined uncertainty, resulting e. g. from the error in measurement, or the uncertainty can be added to the input data based on theoretical assumptions. As an example, a 10% uncertainty can be assumed (i.e. density+/−10%), and a standard deviation can be calculated based on this, e.g. std=(density*0.1)/2.

Providing the PDF for the modelled data comprises calculating multiple modelled data representing a distribution of modelled data values, e. g. based on Monte Carlo simulations for at least one specified model parameter. For calculating the model constraints, a distribution function is applied to the at least one specified model parameter. Using a rock physics model in the Monte Carlo simulation, a plurality of modelled data is calculated having the PDF.

If the probability distribution functions are provided for both of the input data and the modelled data, the model probabilities preferably are obtained by superimposing the input data probability distribution functions and the modelled data probability distribution functions. With this embodiment, the model parameters to be predicted are preferably provided by those values of the model parameters having a maximum overlap of the modelled data probability distribution functions and the input data probability distribution functions.

If the probability distribution functions are provided for one of the input data and the modelled data only, the model probabilities are obtained by superimposing the input data or the modelled data with the probability distribution functions of the modelled data or the input data, resp.

According to a particularly preferred embodiment of the invention, the input data are derived from measurements of multiple of the data parameters at the geological formation and multiple model constraints of the model parameters are calculated by applying multiple rock physics models on the model parameters, each of said model constraints including modelled data of one of the multiple data parameters. With this embodiment, a global model probability based on the model probabilities of the predicted model parameters is calculated, e. g. by calculating the product thereof. Advantageously, the reliability of the prediction is increased by the combination of multiple model constraints. With preferred examples, 2, 3 or more model constraints are considered.

According to a further advantageous embodiment of the invention, the inverse model solver process includes defining a cut-off threshold criterion for rejecting a range of values of the model parameters resulting in a model probability below a threshold probability. With this embodiment, improbable results can be excluded.

Further independent subjects of the invention are a computer program residing on a computer-readable medium, with a program code which, when executed on a computer, carries out the method according to the invention, and an apparatus comprising a computer-readable storage medium containing program instructions which, when executed on a computer, carry out the method according to the invention.

In summary, the invention provides in particular the following advantages. The inventive inverse modelling is highly data and theory (geophysics, geology, petrophysics, etc.) driven. It integrates statistics, but it is not a statistically driven method. It handles uncertainty and probabilities; even Bayesian type of probability can be included. Each solution can be tracked back to the initial assumptions; which in turn can be used in evaluating the solutions. Data, solver and models are all separated; making it highly scalable: It can be used on various type of data, e. g. 1D (e.g. well log), 2D (e.g. seismic section), 3D (seismic cube), etc. Different solvers can be used, and new models can be easily added, and can either be distributed in a specified form for the user to model (e.g. using Rock.XML and a parser), or pregenerated constraint cubes. The model space can easily be inspected in advance (or after) any inverse modelling, either manually or automatically (e.g. running sensitivity analysis to evaluate which combinations of input data is favorable). The solution space can be inspected in various ways.

BRIEF DESCRIPTION OF THE DRAWINGS

Further details and advantages of the invention are described in the following with reference to the attached drawings, which show in:

FIG. 6: schematic illustrations of a preferred embodiment of the model parameter prediction method according to the invention;

DESCRIPTION OF THE PREFERRED EMBODIMENTS

Features of preferred embodiments of the invention are described in the following with particular reference to the provision of the PDFs to the modelled data of the data parameters, the application of the inverse model solver process on the basis of the PDFs, and the provision of the model probabilities. Details of selecting appropriate data and model parameters, selecting rock physics models, calculating model constraints and iterative conducting the inverse model solver process are not described as far as they are known from conventional techniques, e. g. described by T. A. Johansen et al. or in the dissertation of Erling Hugo Jensen (cited above) and references cited therein. The numerical implementation of the invention is done with standard software tools, like e. g. MATLAB, using standard hardware, like a computer.

Particular reference is made to the model parameters porosity, clay content and fluid saturation (PLF parameters) to be predicted. The application of the invention is not restricted to these parameters but rather correspondingly possible with other parameters as exemplified above. For predicting other parameters, rock physics models can be applied as disclosed in the literature and cited as examples above.

Figure 1:
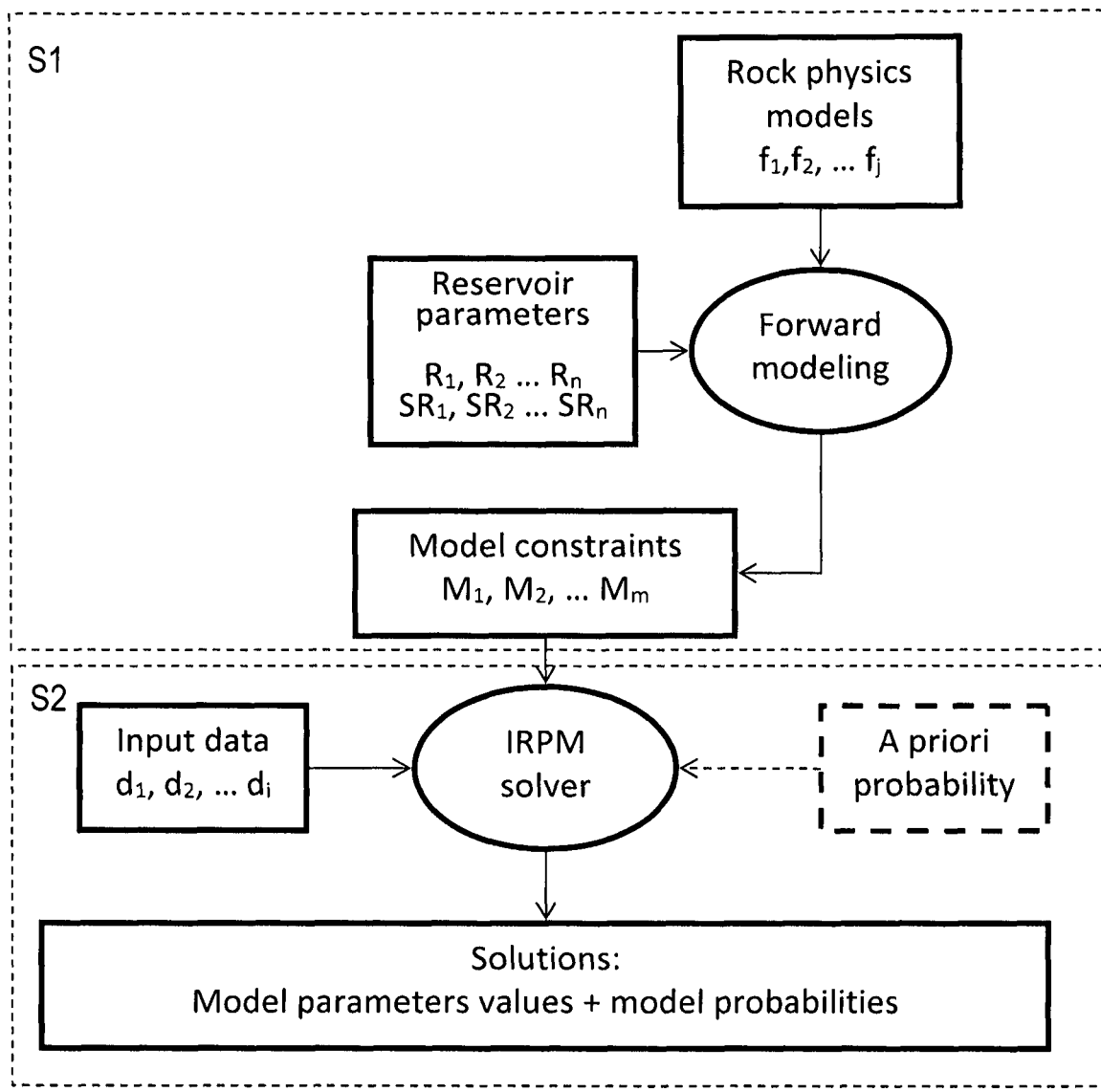
FIG. 1: a flow chart illustrating features of inventive model parameter prediction methods according to the invention.
Figure 2:
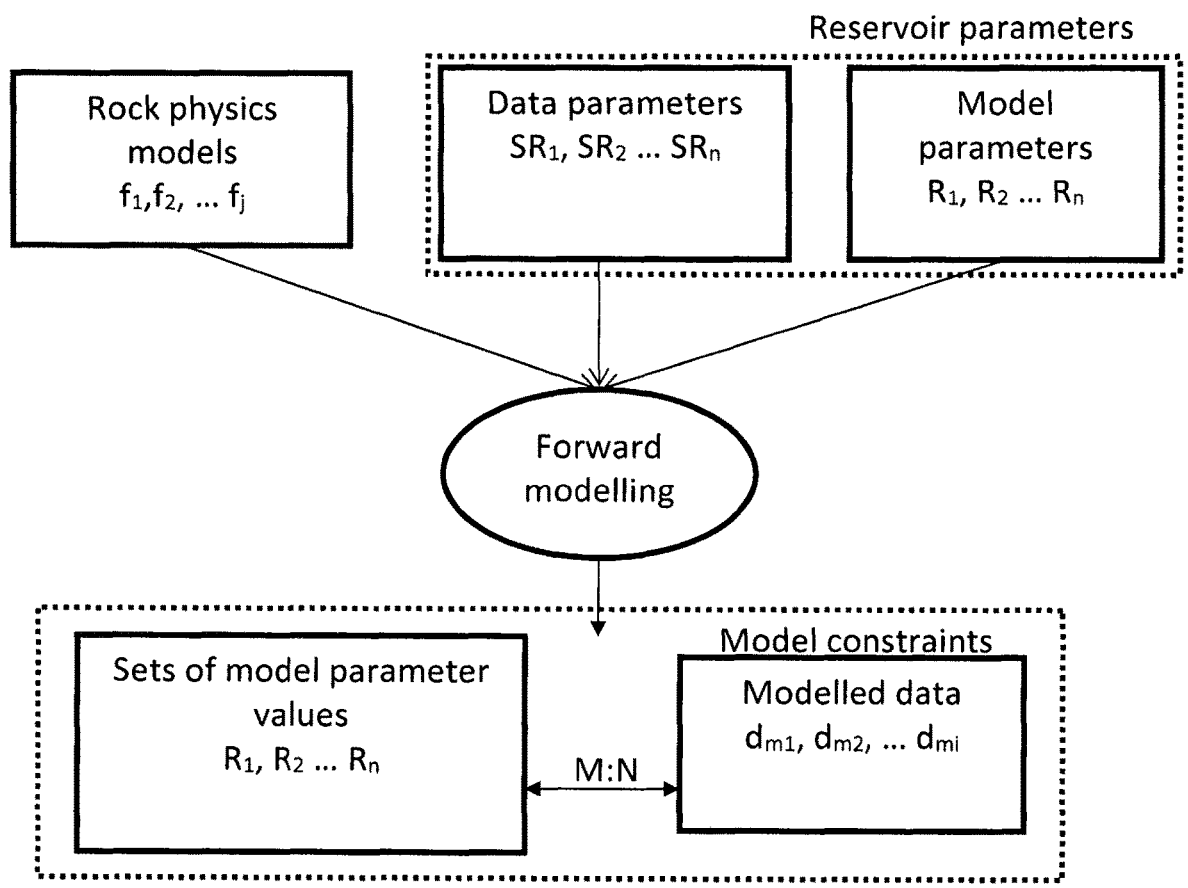
FIG. 2: a schematic representation of calculating model constraints.
Figure 3:
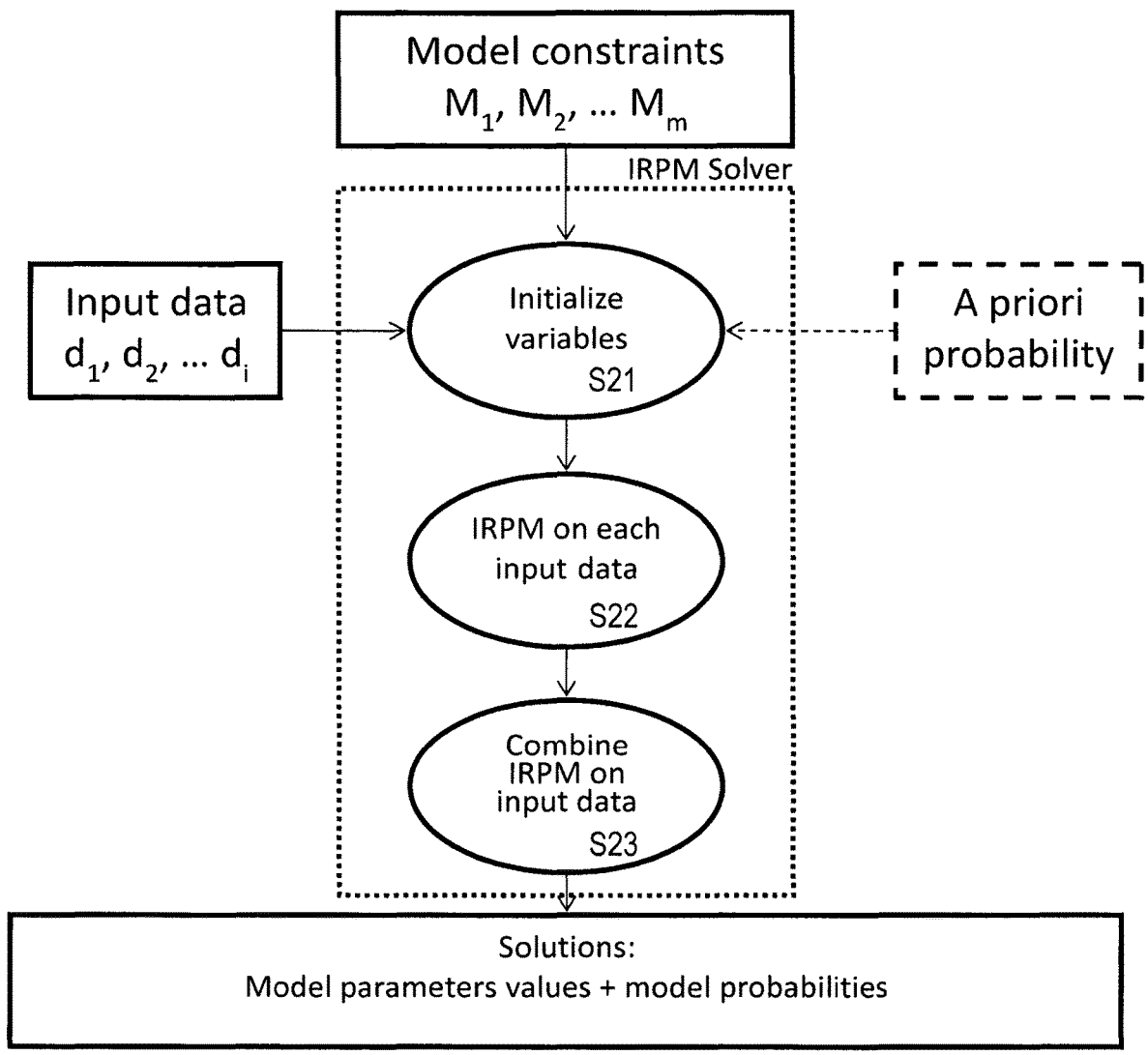
FIG. 3: a schematic representation of conducting the inverse model solver process.
Figure 4:
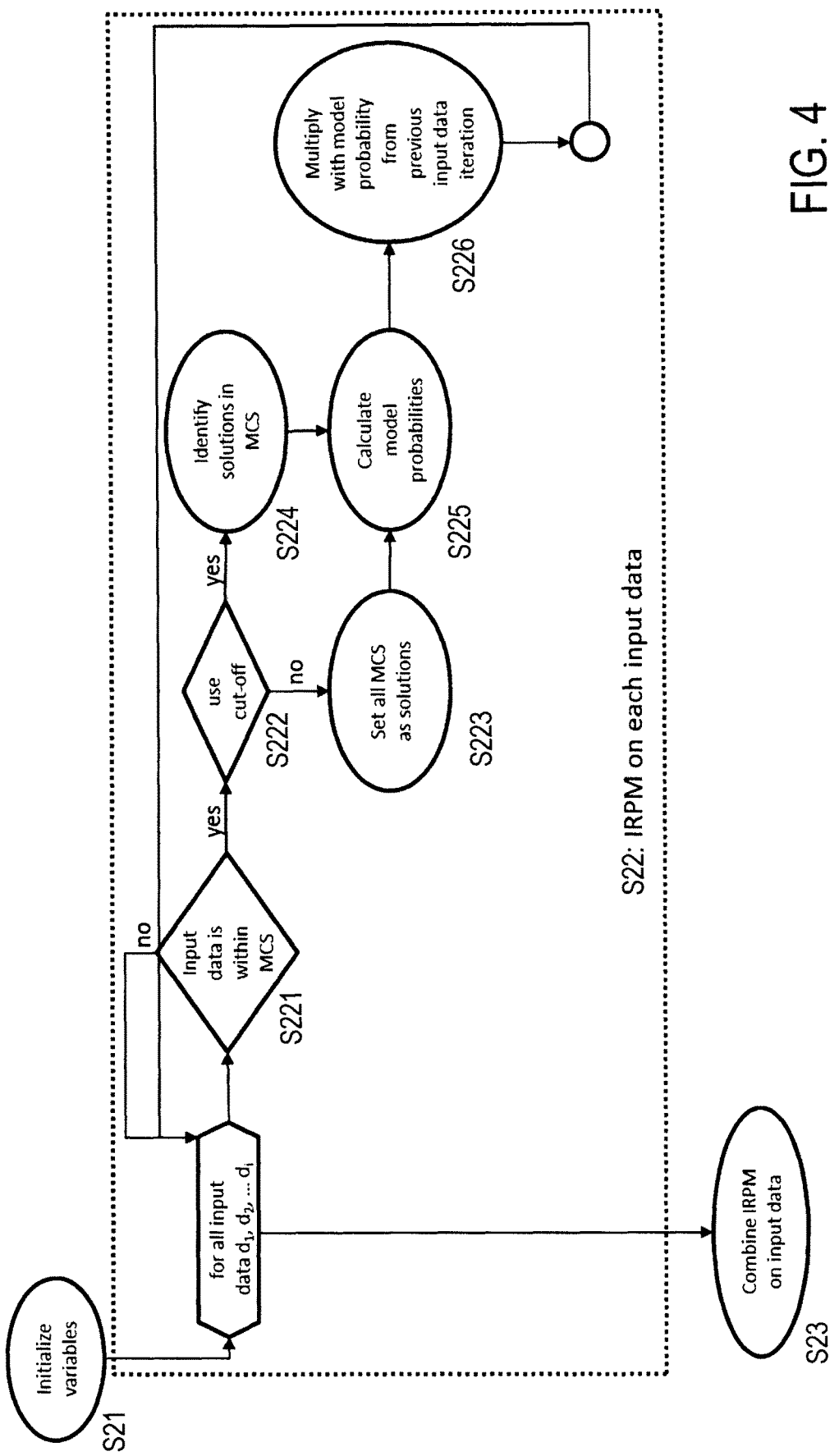
FIGS. 4 and 5: flow chart illustrating further details of the inverse model solver process.
Figure 5:
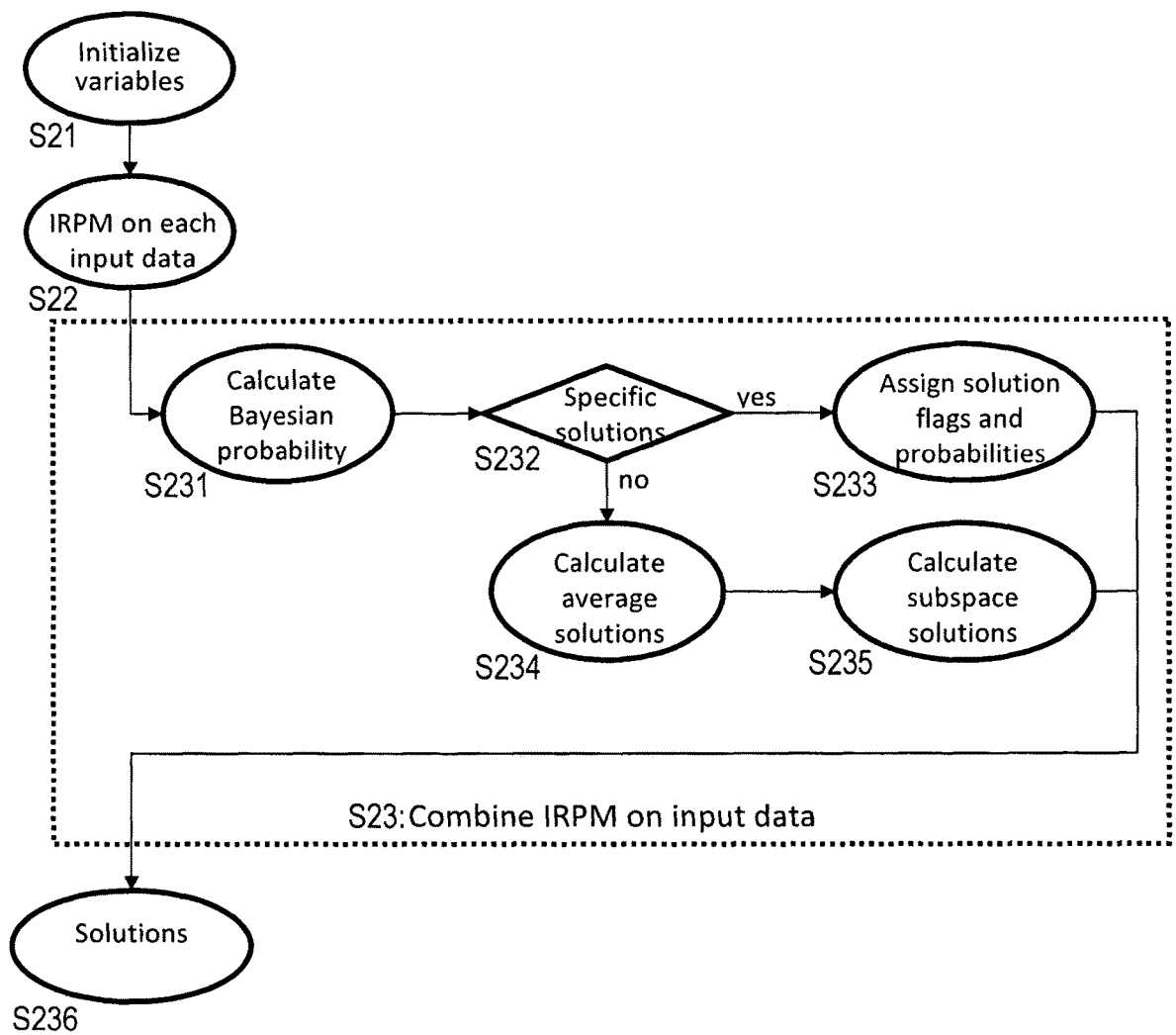

FIGS. 1 to 3 show an overview of the inventive model parameter prediction method including a general step S1 of forward modelling (further details in FIG. 2) and a general step S2 of inverse modelling (further details in FIGS. 3 to 5). Exemplary reference is made to the application of the invention with multiple different data and model parameters and multiple different rock physics models used for calculating multiple model constraints. The invention is not restricted to this, but rather possible with one-dimensional data, i. e. processing one data parameter (see FIGS. 6A, 6B).

Forward modelling S1 (FIGS. 1 and 2) includes providing rock physics models $f_1, f_2, f_3, \ldots$ and reservoir parameters including model parameters $R_1, R_2, R_3, \ldots$ and data parameters $SR_1, SR_2, SR_3, \ldots$ to be used for applying a forward modelling procedure resulting in model constraints $M_1, M_2, M_3, \ldots$. The data parameters $SR_1, SR_2, SR_3, \ldots$ comprise the types of observable properties the values of which being input to the inverse modelling S2. As the inverse modelling S2 is directed on finding the forward model resulting in a matching of the input and modelled data, the data parameters $SR_1, SR_2, SR_3, \ldots$ are considered as an input of the forward modelling as well.

Furthermore, forward modelling S1 includes calculating the model constraints M1, M2, M3, . . . of the model parameters R1, R2, R3, . . . by applying the rock physics models f1, f2, f3, . . . on the model parameters R1, R2, R3, . . . . The rock physics models use the model parameters as input to predict the modelled data of the data parameters. The derived relations between the model and data parameters provide the model constraints. The rock physics models are continuous functions, but for practical purposes when doing the calculations on a computer they are discretized through sampling; defining a set of nodes.

Figure 8:
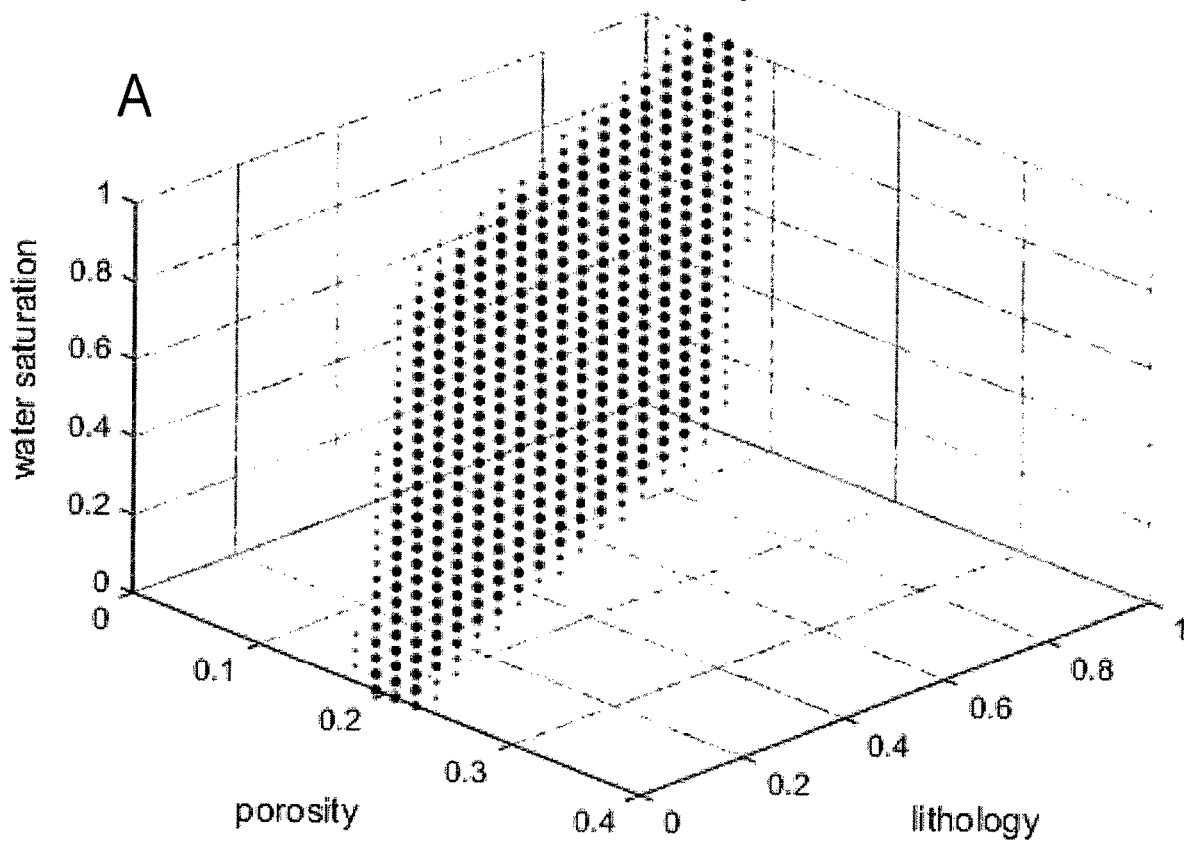
FIG. 8: a schematic illustration of combining multiple model constraints according to the invention.

With a practical example, porosity, clay content and fluid saturation (gas-to-brine saturation) are chosen as model parameters. The forward modelling will then generate a 3D model constraint (constraint cube) where each axes is associated with a respective focused property (see FIGS. 6A and 8). The values of the chosen model parameters are sampled over a range of values, e.g. the fluid saturation 0, 0.1, 0.2, . . . 1.0. Density and seismic velocities of sound having different polarizations can be chosen as data parameters.

According to the invention, probability distribution functions (PDFs) are provided for the data parameters, preferably at least for the modelled data. To this end, calculating the modelled data $d_{m1}, d_{m2}, \ldots d_{mi}$ of the model constraints is repeated a plurality of times based on Monte Carlo simulations for the model parameters. As an example, the Monte Carlo simulations include 50 iterations. A plurality of modelled data are obtained for each node of the model constraint in the form of a PDF, specified e. g. with a mean value and standard deviation. As a result, a plurality of modelled data (number N) matching one set of model parameters values (i.e. a node) are obtained with a plurality of nodes (number M).

With an example, the reservoir parameters effective density may comprise quartz density, clay density and lithology (i.e. volume fraction of quartz and clay). The effective density is the observable data parameter, while the others are model parameters. The lithology is the model parameter to be predicted, while the others are specified model parameters. A distribution function can be applied to both of the quartz and clay density, or one of them is fixed, e. g. the quartz density is fixed to 2.65 g/cm³, while the distribution function is applied for the clay density. A rock physics model is used in the Monte Carlo simulation. As a result the calculated modelled effective density (modelled data) will also have a PDF.

Because calculating the model constraints can be time consuming, preferably the model constraints are stored instead of calculating them every time. A node-template, like a matrix or a table of memory positions corresponding to the nodes, is used for storing them. If a higher (or lower) resolution of the nodes is required, a new set of functions can be created which interpolates between the initial nodes. These functions are referred to as model correlation functions by T. A. Johansen et al. as cited above.

Inverse modelling S2 (FIGS. 1 and 3) includes applying an inverse model solver process on observable input data $d_1, d_2, d_3, \ldots$ of the data parameters. Predicted model parameter values and associated model probabilities are calculated, having a mutual matching of the input data and the modelled data.

The inverse model solver process provides not only a single solution, e. g. a single porosity, for a given set of input data and a rock physics model. Instead, it gives a range of possible porosity predictions. A representative solution can be found by calculating the mean value and standard deviation. The same can be done for the other predicted model parameters. But now, using the model probability Pi associated with each of the possible solutions $S_i$, a weighted mean $\bar{S}_w$ can instead be calculated according to $$\bar{S}_w = \frac{\sum_{i=1}^{N} P_i S_i}{\sum_{i=1}^{N} P_i}$$

where i is an index running over the N possible solutions.

There are a number of different measures available for collecting the observable input data. Depending on the application of the invention, the input data can be derived from one single or from different sources. For example, density can be derived from well log measurements, seismic data and gravitational data. As a further example, electrical resistivity can be obtained with well log or controlled source electromagnetic (CSEM) measurements. Each input data can be given a specific value, e. g. obtained by measurement, or be defined through a PDF, e.g. density=2 g/cm³, or have a mean value of 2 g/cm³ and a standard deviation of 0.02 g/cm³.

Optionally, an a priori probability can be input to the inverse model solver process. The a priori probability is used if it is known that certain solutions are more probable than others, based on other sources of information. The a priori probability can be defined as an additional PDF for the model parameters to be predicted. This information can be used as a direct input to the modelling, or it can be introduced after the solutions are found. It can be used alone, or in combination with the model probability; calculating a Bayesian probability.

As an example, based on a given depth in the geological formation, it might be known that it is very unlikely to find high porosities. However, it would be possible that a particular rock physics model with certain calibrated model parameters would give a good match with the input data and predicting a high porosity. Using the a priori probability in the inverse model solver process would not exclude solutions despite of a good match of input and modelled data.

The inverse model solver process includes the steps of initializing variables of the iterative matching procedure (step S21), applying the iterative matching procedure on each input data (step S22, see FIG. 4) and combining the solutions obtained with each of the input data (step S23, see FIG. 5). The inverse model solver process uses the node template when identifying the possible solutions. One of the inverse model solver processes used by T. A. Johansen et al. or Erling Hugo Jensen (cited above) applies the so-called Newton-Raphson based solver which uses the model correlation functions directly, instead of the nodes to identify solutions, wherein repeated calculations are performed minimizing an error-parameter until a specified threshold value.

The inverse model solver process applied on each input data results in a matching of the forward model and the model parameters included therein such that the modelled data in the model constraint matches the input data. Forward modelling is repeated for all combinations of sampled focused model parameter values (nodes). Thus, each application of the inverse model solver process results in a plurality of solutions corresponding to the number of modelled data (PDF) available at each node. According to the invention, a model probability related to the various solutions for a given model (and input data) is calculated. The model probability expresses how well the data fits the model.

FIGS. 4 and 5 show further details of the inverse model solver process. According to FIG. 4, for each of the input data, the inverse model solver process includes an initial test S221, whether the input data are within the model constraint space (MCS), i.e. the domain correlating target reservoir values to input data values. In practice, the MCS is the model constraint cube. Advantageously, this is the fastest way to identify non-existing solutions. Then, there is a decision step S222 for optional applying a cut-off criterion (see FIG. 7) on using the model constraints for finding solutions. If a cut-off is not being used, all possibilities within the constraint cube are considered solutions in S223, but with varying probability. If a cut-off is being used, then only solutions within the constraint cube with a probability above the assigned threshold will be considered a solution in S224. Associated model probabilities are calculated at step S225. Finally, the model probabilities are multiplied at step S226 for obtaining a global model probability.

According to FIG. 5, combining the solutions obtained with each of the input data can include a calculation of a Bayesian probability of solutions at step 231. This embodiment is only significant if an a priori probability has been defined. Then, there is a test for specific solutions at step 232. If the solver is calculating specific solutions, then all identified solutions in the constraint cube are flagged and probabilities are calculated for them in step S223. If the solver is not calculating specific solutions, i.e. it is calculating general solutions, then all identified solutions are represented with various "averages" and subspace solutions in steps S234 and S235. The "averages" can be means and variances, weighted means, solutions with highest probabilities, etc. Finally, the solutions are output at step 236.

At least one subspace of the at least one model constraint can be defined for facilitating an identification of appropriate solutions. Predicted subspace model parameters are calculated for the at least one subspace using the inverse model solver process. The predicted subspace model parameters and associated model probabilities for the at least one sub-space are compared with the predicted model parameters of the overall model constraint. As an example, a hydrocarbon saturated sandstone, which might be one of the facies to be identified, is not represented by a single solution in the model space. A sub-space is defined containing the subset of solutions for this facies. Similarly, other facies can be defined. The model probabilities for this facies are calculated according to:

$$P_{facies} = P_{F,max} \frac{\sum_{j=1}^{F} P_j}{\sum_{i=1}^{N} P_i}$$

wherein $P_{F,max}$ is the highest model probability and j is an index running over the F possible solutions for the specified facies. The index i runs over all N possible solutions in the model constraint. Hence, the facies identifier $P_{facies}$ is a scaled relative probability which will be high (close to one) when solutions within are more likely than those outside the facies specification, as well as there exists a solution for that facies which matches very well with the input data.

Advantageously, multiple sub-spaces can be handled in one execution, i.e. it is not necessary to repeat the modelling process for each of the sub-spaces (facies).

As a further advantage of the invention, the inverse model solver process can be applied with e. g. one-dimensional, two-dimensional, three- or even higher-dimensional model constraints, which are presented in FIG. 6A. In the 1D case, modelled data values of one data parameter (presented by circles) are calculated by applying a rock physics model for the sampled model parameter. In the 2D, 3D and ND cases, the modelled data values are calculated for sets of the sampled model parameters. The three-dimensional model constraint is a constraint cube, which is spanned e. g. by the PLF values noted above, wherein e.g. a density value ρ is calculated for each PLF triple. Each node has as many values as repetitions in the Monte Carlo simulation per forward modelled data property; these values can e.g. be represented through a mean and standard deviation (assuming a normal distribution) as exemplified in FIG. 6A.

FIG. 6B illustrates the matching of input data (represented by arrow) with the $PDF_{modelled}$ of the modelled data at the nodes of the 1D model constraint. The input data are provided with an uncertainty presented with a $PDF_{input}$, which is overlapped with the $PDF_{modelled}$ of the modelled data at each node (FIG. 6C). The integral of the overlapping PDFs is the model probability of the solution at the respective node.

FIG. 6D illustrates an alternative way of estimating the model probability (model likelihood) for an input data given by a value range, e. g. characterized by a mean value μ and standard deviation σ. In this case, the model probability is obtained by calculating the integral of the model probability density function from μ−σ to μ+σ.

Figure 7:
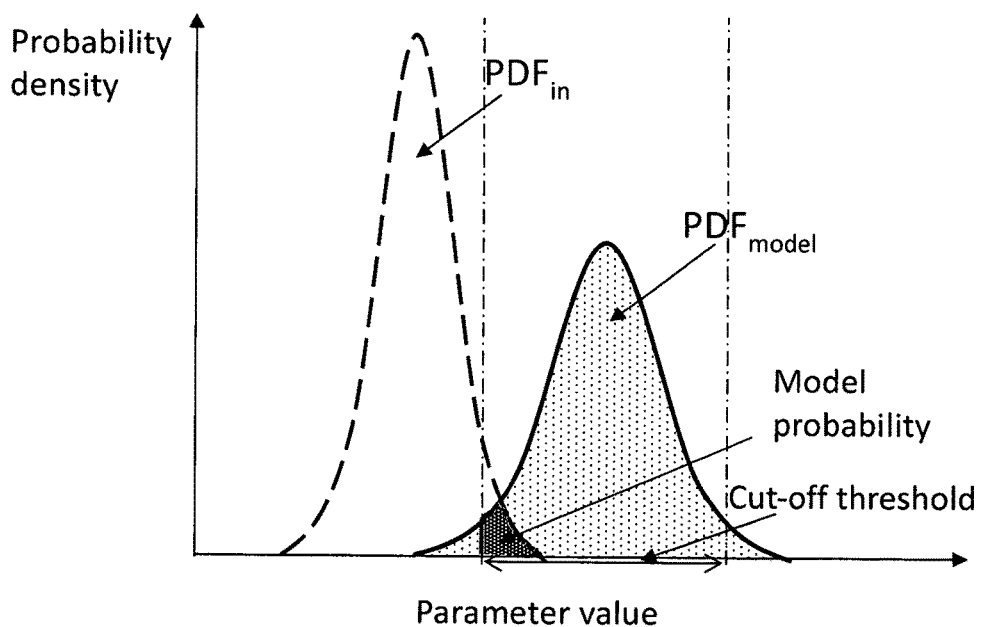
FIG. 7: a schematic illustration of defining a cut-off threshold criterion.

The PDFs always have an overlap even in infinity. For improved performance, the inverse model solver process includes a cut-off threshold criterion for rejecting a range of values of the model parameters resulting in a model probability below a threshold probability. The cut-off threshold is defined to reject solutions that have very low model probability (poor match between data and model). This can for example be done by setting a threshold to the model probability (integral of overlapping pdfs) as shown in FIG. 7 or as a factor times the standard deviation adjusted based on the change in mean value from node to node.

FIG. 8A to 8C illustrate plots of model probability of solutions for various input data, namely P-wave acoustic impedance, ratio of P-wave and S-wave velocities and density. The probability is reflected in the dot size, wherein smaller dots represent less probable solutions. Finally the solutions are intersected to reject solutions outside the threshold and total model probability is found by taking the product of the individual model probabilities as presented in FIG. 8D and FIG. 8E, which is a rotated version of FIG. 8D.

The features of the invention disclosed in the above description, the drawing and the claims can be of significance both individually as well as in combination or sub-combination for the realisation of the invention in its various embodiments.

The invention claimed is:

1. A method of predicting values of one or more model parameters of a geological formation under investigation, wherein said geological formation is distinguished by reservoir parameters including observable data parameters and the model parameters to be predicted, comprising the steps of:
   a) generating at least one model constraint of the model parameters by applying at least one rock physics model to the model parameters, said at least one model constraint including modelled data of at least one of the data parameters,
   b) applying an inverse model solver process on observed input data of at least one of the data parameters, said observed input data being derived from a measurement, including predicted model parameters, which comprise values of the model parameters which give a mutual matching of the input data and the modelled data, wherein applying an inverse model solver process comprises:
      i) providing the modelled data with probability distribution functions,
      ii) conducting the inverse model solver process based on the probability distribution functions of the modelled data, wherein multiple predicted values of the model parameters are obtained comprising values of the model parameters which give the mutual matching of the input data and the modelled data, and
      iii) generating model probabilities of the predicted values of the model parameters based on the probability distribution functions of the modelled data, and
   c) outputting one or more solutions representing properties of the geological formation based on the generated model probabilities of the predicted values of the model parameters.

2. The method according to claim 1, wherein the values of the model parameters to be predicted are provided by one value of the multiple predicted model parameters having a maximum model probability.

3. The method according to claim 1, wherein the values of the model parameters to be predicted are provided by expected values of a measure of variance for the multiple predicted model parameters.

4. The method according to claim 1, wherein the values of the model parameters to be predicted are provided by averaged values of the multiple predicted model parameters.

5. The method according to claim 1, wherein an a priori probability of the model parameters is included in the inverse model solver process, and the values of the model parameters to be predicted have a maximum a priori probability.

6. The method according to claim 5, wherein a Bayesian probability is included in the inverse model solver process, said Bayesian probability being derived from the model probability and the a priori probability, and the values of the model parameters to be predicted have a maximum Bayesian probability.

7. The method according to claim 1, further comprising the steps of
   defining at least one subspace of the at least one model constraint,
   calculating predicted subspace model parameters for the at least one subspace, and
   comparing the predicted subspace model parameters for the at least one subspace with the predicted values of the model parameters of the overall model constraint.

8. The method according to claim 1, wherein the at least one model constraint comprises nodes of constrained model parameters being constrained by applying the at least one rock physics model.

9. The method according to claim 1, wherein the step of generating the at least one model constraint includes one or more Monte Carlo simulations for the model parameters, resulting in the probability distribution functions of the modelled data of the data parameters.

10. The method according to claim 1, wherein probability distribution functions are provided for the input data, and the model probabilities are obtained by superimposing the input data probability distribution functions and the modelled data probability distribution functions.

11. The method according to claim 10, wherein the values of the model parameters to be predicted are provided by those values of the model parameters having a maximum overlap of the modelled data probability distribution functions and the input data probability distribution functions.

12. The method according to claim 1, wherein the input data are provided based on a measurement of multiple data parameters at the geological formation, multiple model constraints of the model parameters are generated by applying multiple rock physics models on the model parameters, each of said model constraints including modelled data of one of the multiple data parameters, and generating a global model probability based on the model probabilities of the predicted model parameters.

13. The method according to claim 1, wherein the inverse model solver process includes defining a cutoff threshold criterion for rejecting a range of values of the model parameters resulting in a model probability below a threshold probability.

14. The method according to claim 1, wherein the model parameters and the data parameters comprise one or more of the following:
   porosity, lithology, fluid saturation of the geological formation, density, elastic modulus, intercept features, temperature, pressure, velocity of seismic waves, seismic data, sonic data, controlled source electromagnetic data, gravitational data and/or parameters derivable therefrom.

15. A computer program residing on a non-transitory computer-readable medium, with a program code which, when executed on a computer, carries out the method according to claim 1.

16. An apparatus comprising a non-transitory computer-readable storage medium containing program instructions which, when executed on a computer, carry out the method according to claim 1.

17. The method of claim 1, wherein the step of outputting one or more solutions comprises graphically plotting the generated model probabilities of the predicted values of the model parameters.

* * * * *